(12) United States Patent
Chen et al.

(10) Patent No.: US 11,545,521 B2
(45) Date of Patent: Jan. 3, 2023

(54) MAGNETIC TUNNEL JUNCTION (MTJ) DEVICE AND FORMING METHOD THEREOF

(71) Applicant: UNITED MICROELECTRONICS CORP., Hsin-Chu (TW)

(72) Inventors: Wei Chen, Tainan (TW); Hui-Lin Wang, Taipei (TW); Yu-Ru Yang, Hsinchu County (TW); Chin-Fu Lin, Tainan (TW); Yi-Syun Chou, Taipei (TW); Chun-Yao Yang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 5 days.

(21) Appl. No.: 17/157,952

(22) Filed: Jan. 25, 2021

(65) Prior Publication Data

US 2021/0143212 A1 May 13, 2021

Related U.S. Application Data

(63) Continuation of application No. 16/261,584, filed on Jan. 30, 2019, now Pat. No. 10,943,948.

(30) Foreign Application Priority Data

Jan. 14, 2019 (CN) .......................... 201910030827.X

(51) Int. Cl.
*H01L 27/22* (2006.01)
*H01L 23/552* (2006.01)
(Continued)

(52) U.S. Cl.
CPC .......... *H01L 27/222* (2013.01); *G11C 11/161* (2013.01); *H01F 10/3254* (2013.01);
(Continued)

(58) Field of Classification Search
CPC combination set(s) only.
See application file for complete search history.

(56) References Cited

U.S. PATENT DOCUMENTS

| 8,482,966 B2 | 7/2013 | Kang |
| 2010/0214835 A1 | 8/2010 | Ding |
| (Continued) | | |

FOREIGN PATENT DOCUMENTS

CN 101271827 A * 9/2008 ......... B23K 26/0661

OTHER PUBLICATIONS

Apex Magnets, "What Are Magnetic Metals?", posted on Mar. 14, 2015, www.apexmagnets.com, retrieved on Feb. 13, 2020 from the Internet URL: https://www.apexmagnets.com/news-how-tos/what-are-magnetic-metals/ ,Mar. 14, 2015.

*Primary Examiner* — Niki H Nguyen
(74) *Attorney, Agent, or Firm* — Winston Hsu

(57) ABSTRACT

A magnetic tunnel junction (MTJ) device includes two magnetic tunnel junction elements and a magnetic shielding layer. The two magnetic tunnel junction elements are arranged side by side. The magnetic shielding layer is disposed between the magnetic tunnel junction elements. A method of forming said magnetic tunnel junction (MTJ) device includes the following steps. An interlayer including a magnetic shielding layer is formed. The interlayer is etched to form recesses in the interlayer. The magnetic tunnel junction elements fill in the recesses. Or, a method of forming said magnetic tunnel junction (MTJ) device includes the following steps. A magnetic tunnel junction layer is formed. The magnetic tunnel junction layer is patterned to form magnetic tunnel junction elements. An interlayer including a magnetic shielding layer is formed between the magnetic tunnel junction elements.

16 Claims, 9 Drawing Sheets

(51) Int. Cl.
 *H01L 43/10* (2006.01)
 *H01F 41/34* (2006.01)
 *H01L 43/02* (2006.01)
 *G11C 11/16* (2006.01)
 *H01F 10/32* (2006.01)
 *H01L 43/12* (2006.01)

(52) U.S. Cl.
 CPC ............ *H01F 41/34* (2013.01); *H01L 23/552* (2013.01); *H01L 43/02* (2013.01); *H01L 43/10* (2013.01); *H01L 43/12* (2013.01)

(56) References Cited

U.S. PATENT DOCUMENTS

| | | | |
|---|---|---|---|
| 2013/0119496 A1* | 5/2013 | Zeng | ............... H01L 43/12 257/E21.24 |
| 2018/0122415 A1 | 5/2018 | Uchida | |
| 2019/0189502 A1* | 6/2019 | Kim | ............... H01L 21/76804 |
| 2019/0393409 A1 | 12/2019 | Maniscalco | |
| 2020/0119088 A1 | 4/2020 | Hashemi | |

* cited by examiner

MAGNETIC TUNNEL JUNCTION (MTJ) DEVICE AND FORMING METHOD THEREOF

CROSS REFERENCE TO RELATED APPLICATIONS

This application is a continuation of U.S. patent application Ser. No. 16/261,584 filed Jan. 30, 2019, which is herein incorporated by reference in its entirety.

BACKGROUND OF THE INVENTION

1. Field of the Invention

The present invention relates generally to a magnetic tunnel junction (MTJ) device and forming method thereof, and more specifically to a magnetic tunnel junction (MTJ) device including a magnetic shielding layer and forming method thereof.

2. Description of the Prior Art

Magnetoresistive random access memory (MRAM) is a type of memory device containing an array of MRAM cells that store data using resistance values instead of electronic charges. Each MRAM cell includes a magnetic tunnel junction (MTJ) unit whose resistance can be adjusted to represent a logic state "0" or "1."

Conventionally, the magnetic tunnel junction (MTJ) unit is comprised of a fixed magnetic layer, a free magnetic layer, and a tunnel layer disposed there between. The resistance of the magnetic tunnel junction (MTJ) unit can be adjusted by changing a direction of a magnetic moment of the free magnetic layer with respect to that of the fixed magnetic layer. When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The magnetic tunnel junction (MTJ) unit is coupled between top and bottom electrodes, and an electric current flowing through the magnetic tunnel junction (MTJ) from one electrode to another can be detected to determine the resistance, and therefore the logic state of the magnetic tunnel junction (MTJ).

SUMMARY OF THE INVENTION

The present invention provides a magnetic tunnel junction (MTJ) device and forming method thereof, which forms a magnetic shielding layer between magnetic tunnel junction elements to shield stray field induced by each of the magnetic tunnel junction elements, thereby avoid the magnetic tunnel junction elements from being affected by the stray field.

The present invention provides a magnetic tunnel junction (MTJ) device including two magnetic tunnel junction elements and a magnetic shielding layer. The two magnetic tunnel junction elements are arranged side by side. The magnetic shielding layer is disposed between the magnetic tunnel junction elements.

The present invention provides a method of forming a magnetic tunnel junction (MTJ) device including the following steps. An interlayer including a magnetic shielding layer is formed. The interlayer is etched to form recesses in the interlayer. The magnetic tunnel junction elements fill in the recesses.

The present invention provides a method of forming a magnetic tunnel junction (MTJ) device including the following steps. A magnetic tunnel junction layer is formed. The magnetic tunnel junction layer is patterned to form magnetic tunnel junction elements. An interlayer including a magnetic shielding layer is formed between the magnetic tunnel junction elements.

According to the above, the present invention provides a magnetic tunnel junction (MTJ) device and forming method thereof, which forms a magnetic shielding layer between magnetic tunnel junction elements. More precisely, the magnetic tunnel junction elements may be directly disposed in the magnetic shielding layer; the magnetic tunnel junction elements are disposed in an interlayer dielectric layer, and the magnetic shielding layer and the interlayer dielectric layer may be stacked arranged; the magnetic shielding layer may conformally cover sidewalls of the magnetic tunnel junction elements; or, the magnetic tunnel junction elements may be disposed in an interlayer dielectric layer, and the magnetic shielding layer is disposed in a gap of the interlayer dielectric layer. In this way, stray field induced by each of the magnetic tunnel junction elements can be shielded, to avoid the stray field from affecting the magnetic moment of each of the magnetic tunnel junction elements itself.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
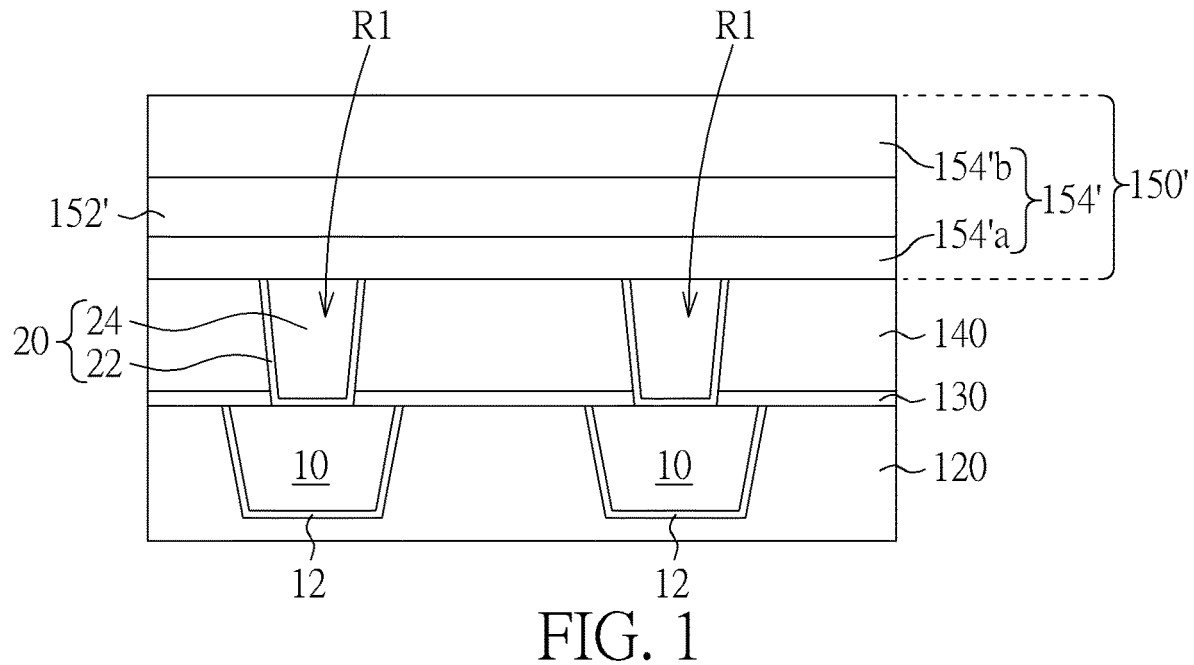
FIG. 1 schematically depicts a cross-sectional view of a method of forming a magnetic tunnel junction (MTJ) device according to an embodiment of the present invention.

FIGS. 1-6 schematically depict cross-sectional views of a method of forming a magnetic tunnel junction (MTJ) device according to an embodiment of the present invention. As shown in FIG. 1, a dielectric layer 120 is formed on a substrate (not shown), wherein the dielectric layer 120 may be an oxide layer, which may be an inter-metal dielectric layer, but it is not limited thereto. The dielectric layer 120 is depicted only in a magnetoresistive random access memory area in this embodiment, and magnetoresistive random access memory cells are in the magnetoresistive random access memory area. Furthermore, the dielectric layer 120 may be formed in other not depicted areas such as logic areas and alignment mark areas etc. A plurality of metal lines 10 are formed in the dielectric layer 120 to connect to magnetic tunnel junction (MTJ) devices upwards. The two metal lines 10 are depicted in the diagrams, but the number of the metal lines 10 is not restricted thereto. The metal lines 10 may include copper, and a barrier layer 12 may surround each of the metal lines 10, wherein the barrier layer 12 may be a tantalum nitride layer, but it is not limited thereto.

A cap layer 130 and a first dielectric layer 140 are formed on the dielectric layer 120, and contact plugs 20 are in the first dielectric layer 140 and the cap layer 130 and connect to the metal lines 10. The cap layer 130 may be a carbon containing nitride layer, while the first dielectric layer 140 may be an oxide layer, but it is not limited thereto. Methods of forming the cap layer 130 and the first dielectric layer 140 may include the following steps. A cap layer (not shown) and a first dielectric layer (not shown) may blanketly cover the dielectric layer 120, the cap layer and the first dielectric layer are patterned to form recesses R1 in the cap layer 130 and the first dielectric layer 140 and expose the metal lines 10, and then the contact plugs 20 fill up the recesses R1, wherein each of the contact plugs 20 may include a barrier layer 22 and a metal 24. Methods of forming the barrier layers 22 and the metals 24 fill up the recesses R1 may include: forming a barrier layer (not shown) conformally covering the recesses R1 and the first dielectric layer 140, a metal (not shown) fills up the recesses R1, removing the metal and the barrier layer exceeding from the recesses R1 by a planarization process to form the barrier layers 22 and the metals 24, wherein the barrier layers 22 surround the metals 24. The barrier layers 22 may be titanium layers, titanium nitride layers or titanium/titanium nitride layers, and the metals 124 may be tungsten, but it is not limited thereto.

An interlayer 150' is formed to cover the first dielectric layer 140 and the contact plugs 20. In this embodiment, the interlayer 150' at least includes a magnetic shielding layer 152'. In this case, the interlayer 150' may include the magnetic shielding layer 152' and an interlayer dielectric layer 154', wherein the magnetic shielding layer 152' and the interlayer dielectric layer 154' are stacked arranged. In one case, the interlayer dielectric layer 154' may include a lower interlayer dielectric layer 154'a and an upper interlayer dielectric layer 154'b stacked from bottom to top, wherein the lower interlayer dielectric layer 154'a, the upper interlayer dielectric layer 154'b and the magnetic shielding layer 152' are stacked arranged, but it is not limited thereto. In this embodiment, the magnetic shielding layer 152' is sandwiched by the lower interlayer dielectric layer 154'a and the upper interlayer dielectric layer 154'b. The interlayer dielectric layer 154' may be an oxide layer, and the magnetic shielding layer 152' may be composed of diamagnetic materials, which may be a dielectric diamagnetic material layer or a metallic diamagnetic material layer etc. to shield stray field or change the paths of the stray field passing through free layers of magnetic tunnel junction elements, but it is not limited thereto. Otherwise, the magnetic shielding layer 152' may be composed of paramagnetic materials such as a Mu metal layer, which may be a nickel iron molybdenum ($FeNi_{80}Mo_5$) alloy layer, and the magnetic shielding layer 152' encloses magnetic tunnel junction elements and keep stray field induced by each of the magnetic tunnel junction elements in its closed space.

Figure 2:
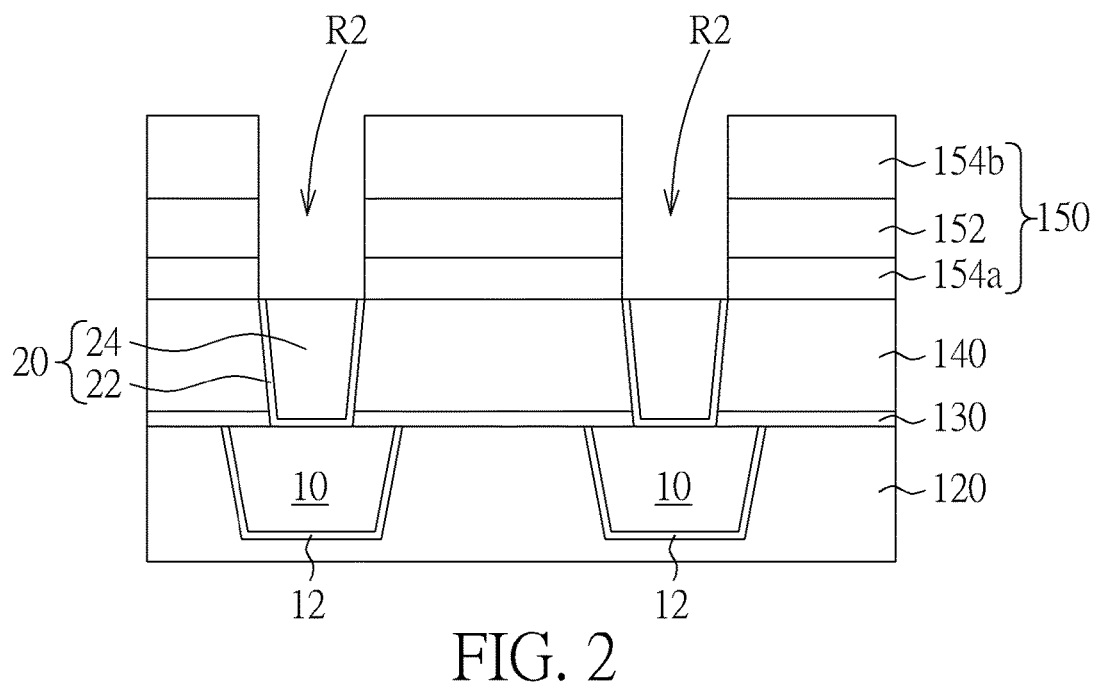
FIG. 2 schematically depicts a cross-sectional view of a method of forming a magnetic tunnel junction (MTJ) device according to an embodiment of the present invention.

As shown in FIG. 2, the interlayer 150' is etched by a process such as a dry etching process to form recesses R2 in an interlayer 150, and expose the contact plugs 20, wherein the interlayer 150 may include a lower interlayer dielectric layer 154a, a magnetic shielding layer 152 and an upper interlayer dielectric layer 154b stacked from bottom to top.

Figure 3:
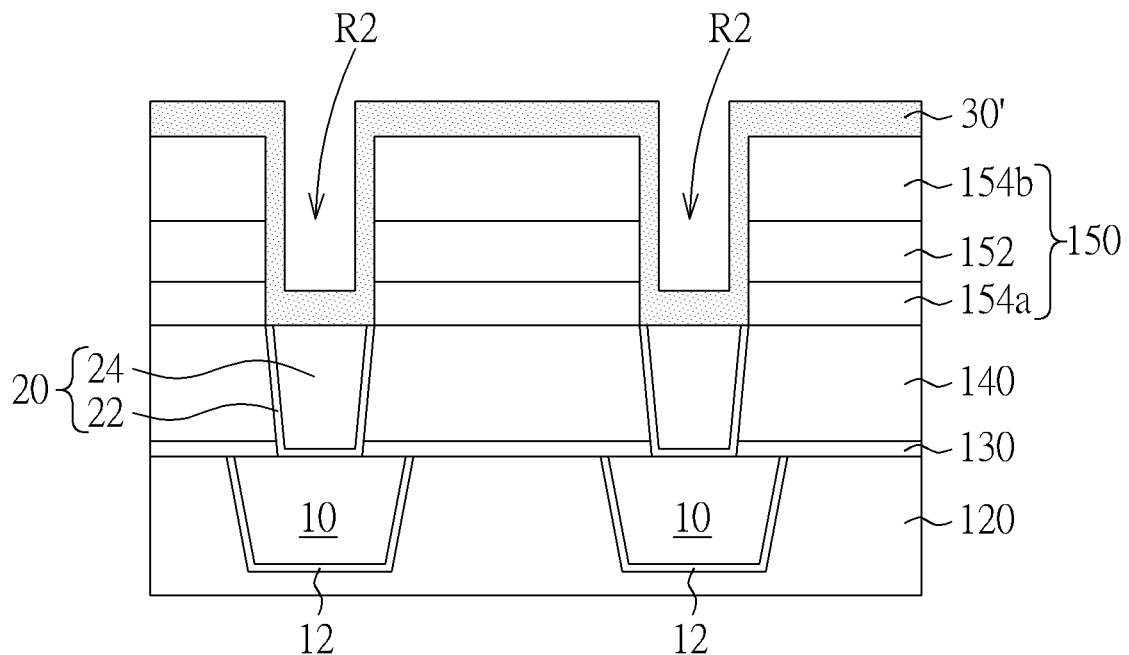
FIG. 3 schematically depicts a cross-sectional view of a method of forming a magnetic tunnel junction (MTJ) device according to an embodiment of the present invention.
Figure 4:
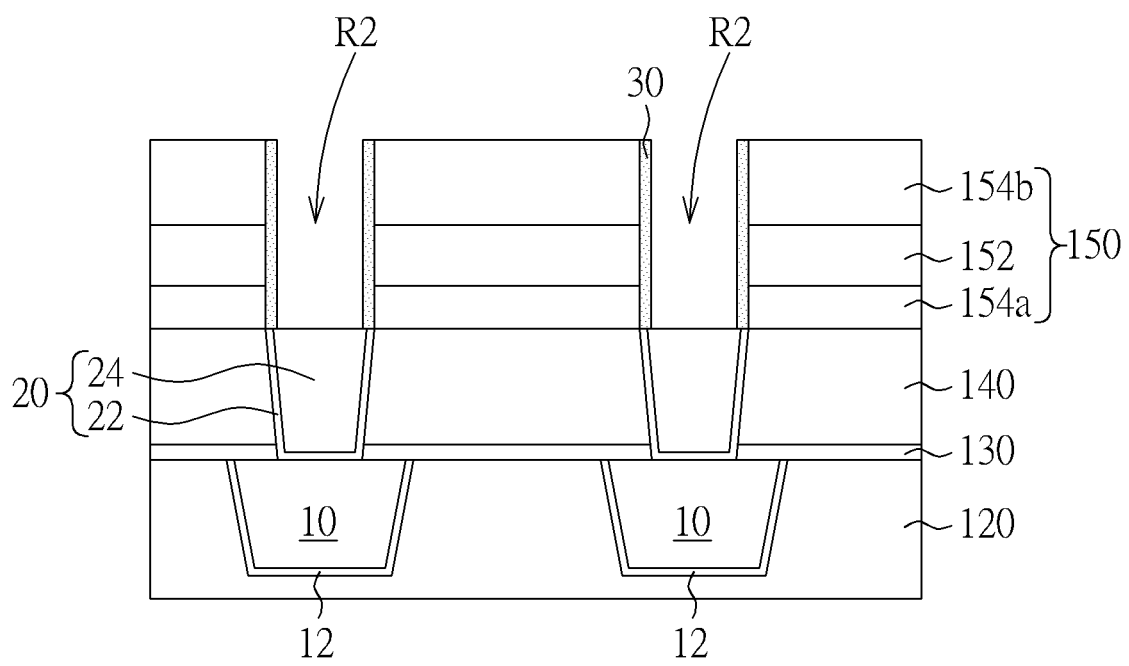
FIG. 4 schematically depicts a cross-sectional view of a method of forming a magnetic tunnel junction (MTJ) device according to an embodiment of the present invention.

Please refer to FIGS. 3-4, insulators 30 may be formed optionally to cover the recesses R2. The insulators 30 may be dielectric layers such as oxide layers or nitride layers, but it is not limited thereto. In this embodiment, the insulators 30 only cover sidewalls of the recesses R2. More precisely, as shown in FIG. 3, an insulator 30' may be formed to conformally cover the contact plugs 20, the sidewalls of the recesses R2 and the interlayer 150. As shown in FIG. 4, the insulator 30' covering the contact plugs 20 and the interlayer 150 is removed by methods such as etching to form the insulators 30 covering the sidewalls of the recesses R2 but exposing the contact plugs 20 and the interlayer 150.

Figure 5:
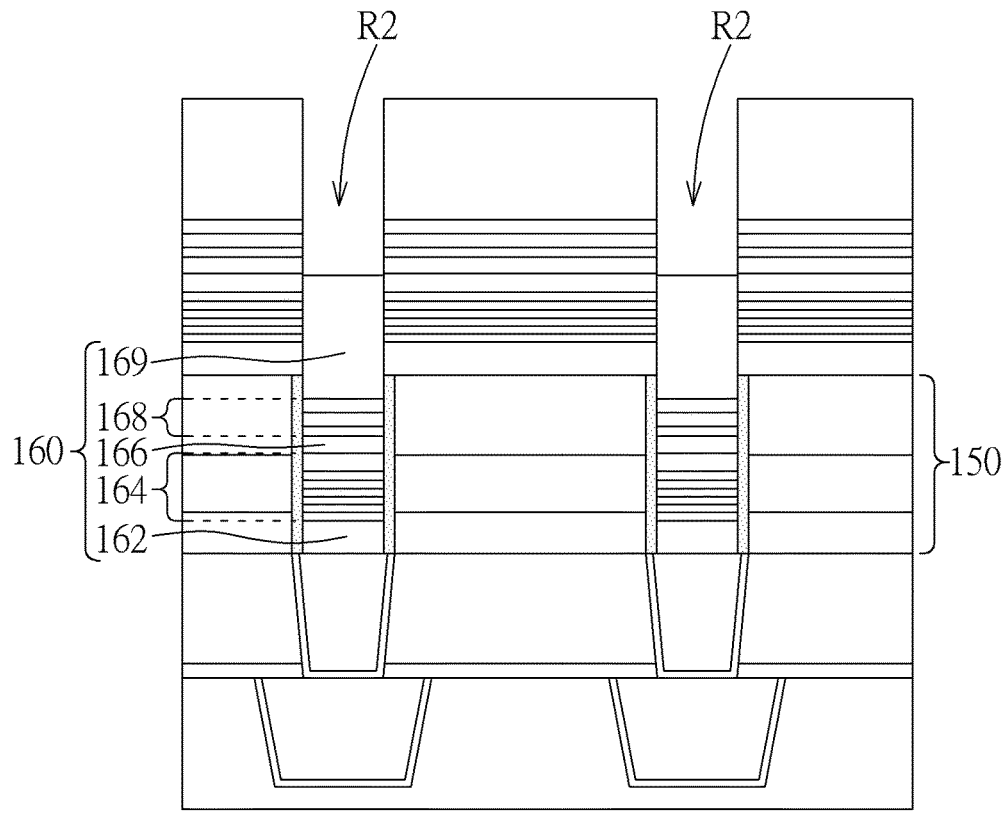
FIG. 5 schematically depicts a cross-sectional view of a method of forming a magnetic tunnel junction (MTJ) device according to an embodiment of the present invention.
Figure 6:
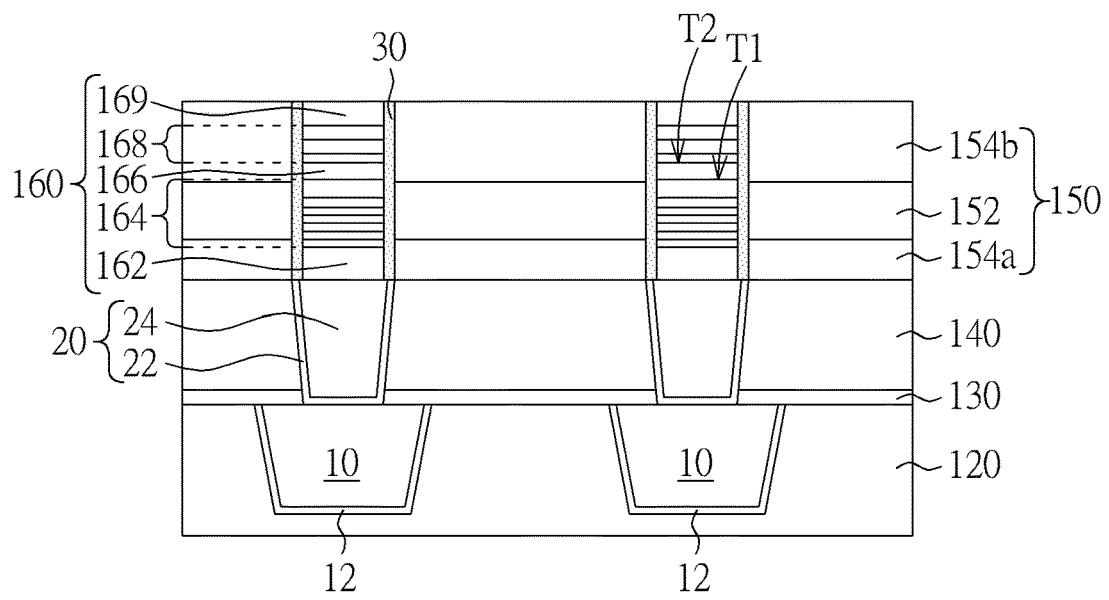
FIG. 6 schematically depicts a cross-sectional view of a method of forming a magnetic tunnel junction (MTJ) device according to an embodiment of the present invention.

Thereafter, magnetic tunnel junction elements 160 fill into the recesses R2, as shown in FIGS. 5-6. Each of the magnetic tunnel junction elements 160 may include a bottom electrode 162, a pin layer 164, a tunneling barrier layer 166, a free layer 168 and a top electrode 169 stacked from bottom to top. As shown in FIG. 5, the bottom electrode 162, the pin layer 164, the tunneling barrier layer 166, the free layer 168 and the top electrode 169 are sequentially stacked in the recesses R2 and on the interlayer 150. Then, the bottom electrode 162, the pin layer 164, the tunneling barrier layer 166, the free layer 168 and the top electrode 169 on the interlayer 150 are removed and the bottom electrode 162, the pin layer 164, the tunneling barrier layer 166, the free layer 168 and the top electrode 169 in the recesses R2 are reserved, as shown in FIG. 6. In this way, the magnetic tunnel junction elements 160 are arranged side by side, and the magnetic shielding layer 152 is disposed between the magnetic tunnel junction elements 160. The magnetic shielding layer 152 shields stray field induced by each of the magnetic tunnel junction elements 160, to avoid the stray field from affecting these magnetic tunnel junction elements 160.

Above all, the magnetic shielding layer 152' may be composed of diamagnetic materials. As the magnetic shielding layer 152 is a dielectric diamagnetic material layer, the magnetic shielding layer 152 may directly cover or contact the two magnetic tunnel junction elements 160 because of the magnetic shielding layer 152 being a non-conductive layer. Thereby, the insulators 30 may not be formed. As the magnetic shielding layer 152 is a metallic diamagnetic material layer or a nickel iron molybdenum alloy (Mu metal) layer, the insulators 30 should be disposed between the magnetic shielding layer 152 and the magnetic tunnel junction elements 160 to electrically isolate the magnetic tunnel junction elements 160 from the magnetic shielding layer 152.

Figure 7:
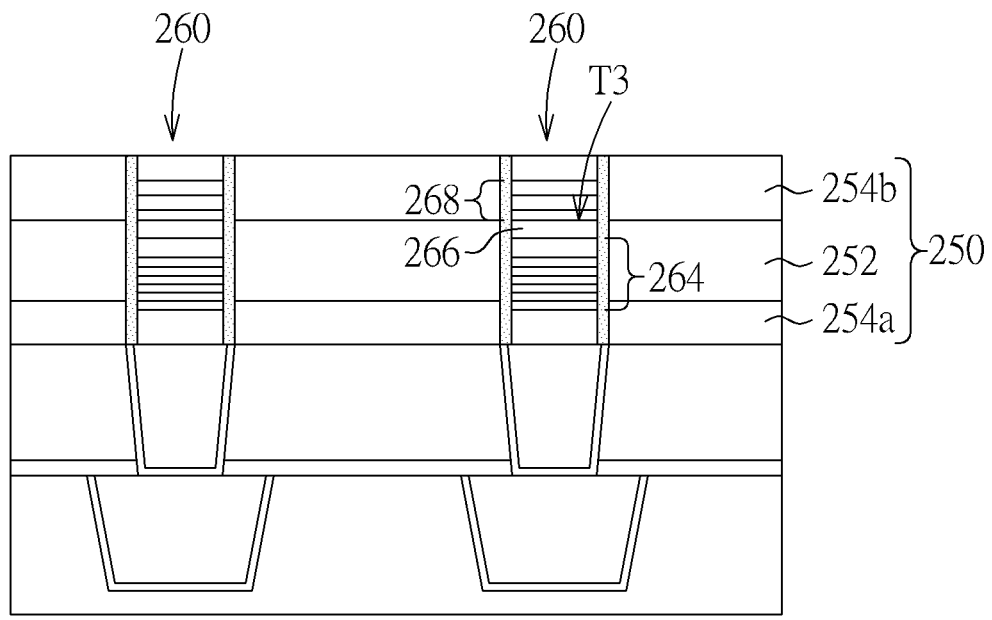
FIG. 7 schematically depicts a cross-sectional view of a magnetic tunnel junction (MTJ) device according to an embodiment of the present invention.

In this embodiment, the magnetic shielding layer 152 is sandwiched by the lower interlayer dielectric layer 154a and the upper interlayer dielectric layer 154b, and the magnetic shielding layer 152 (horizontally) overlaps the pin layers 164 to avoid stray field induced by the pin layers 164 of the magnetic tunnel junction elements 160 from affecting above material layers such as free layers 168. Preferably, the magnetic shielding layer 152 overlaps at least one of interfaces T1 of the pin layers 164 and the tunneling barrier layers 166, and interfaces T1 of the free layers 168 and the tunneling barrier layers 166, to avoid stray field induced by the pin layers 164 of the magnetic tunnel junction elements 160 from affecting the free layers 168. In this case, the magnetic shielding layer 152 overlaps the interfaces T1 of the pin layers 164 and the tunneling barrier layers 166, but it is not limited thereto. As shown in FIG. 7, a magnetic shielding layer 252 in an interlayer 250 is sandwiched by a lower interlayer dielectric layer 254a and an upper interlayer dielectric layer 254b, and the magnetic shielding layer 252 (horizontally) overlaps interfaces T3 of tunneling barrier layers 266 and free layers 268, to avoid stray field induced by pin layers 264 of magnetic tunnel junction elements 260 from passing through the magnetic shielding layer 252 and affecting free layers 268.

Figure 8:
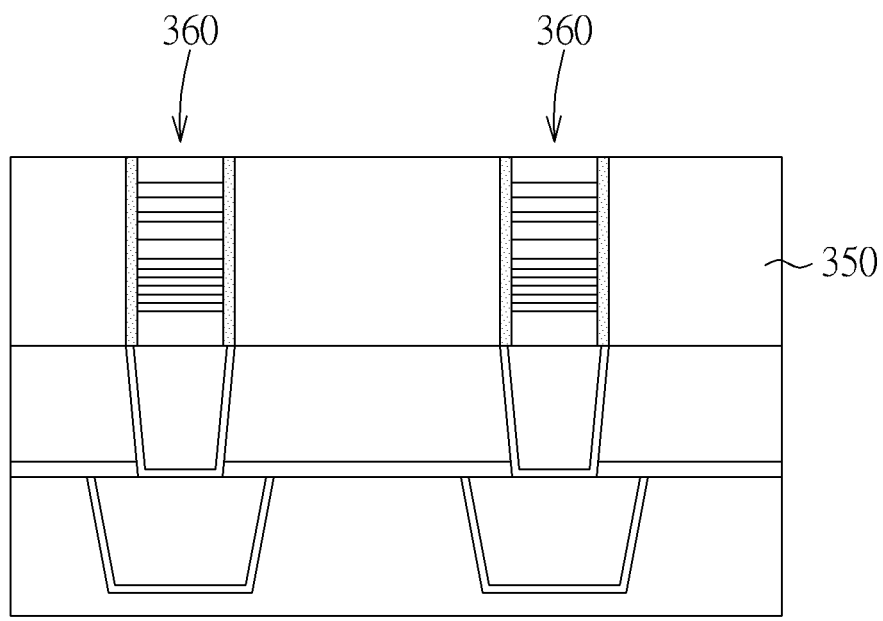
FIG. 8 schematically depicts a cross-sectional view of a magnetic tunnel junction (MTJ) device according to an embodiment of the present invention.
Figure 9:
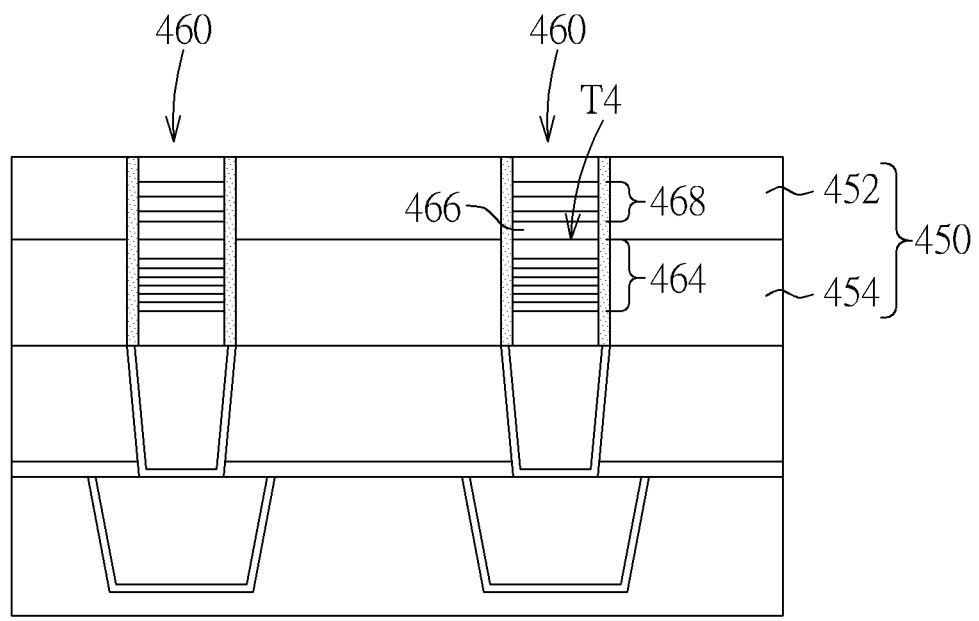
FIG. 9 schematically depicts a cross-sectional view of a magnetic tunnel junction (MTJ) device according to an embodiment of the present invention.
Figure 10:
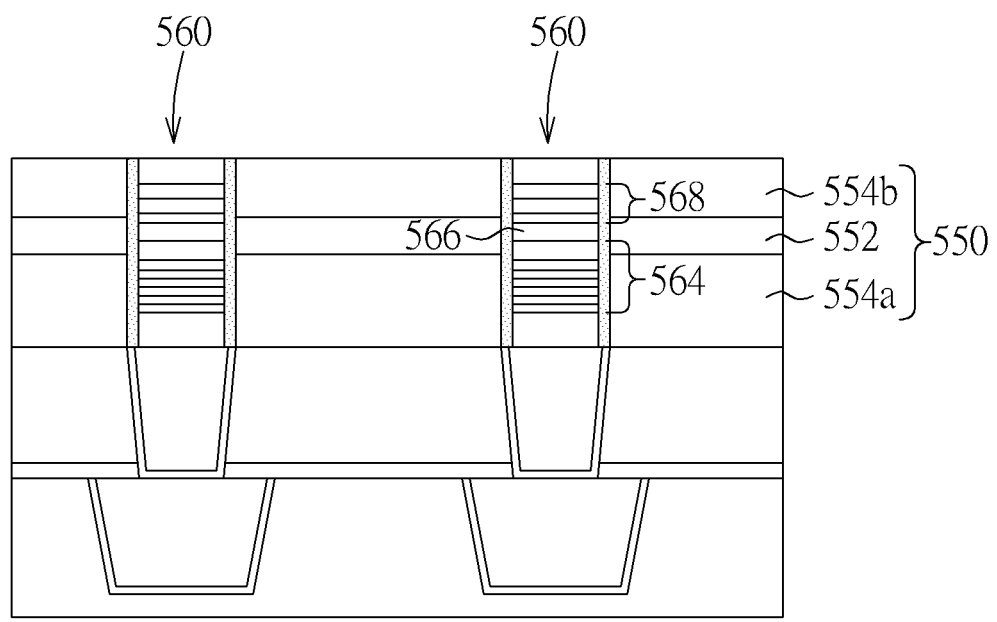
FIG. 10 schematically depicts a cross-sectional view of a magnetic tunnel junction (MTJ) device according to an embodiment of the present invention.

The overlapping relations of the magnetic shielding layer 152/252 and the pin layers 164/264, the tunneling barrier layers 166/266 and the free layers 168/268 depend upon practical requirements for shielding stray field effectively. As shown in FIG. 8, magnetic tunnel junction elements 360 may be in a magnetic shielding layer 350 to shield stray field effectively. Instead, as shown in FIG. 9, a magnetic shielding layer 452 in an interlayer 450 is stacked on an interlayer dielectric layer 454, and the magnetic shielding layer 452 overlaps tunneling barrier layers 466 and free layers 468 of magnetic tunnel junction elements 460, wherein the magnetic shielding layer 452 overlaps interfaces T4 of the tunneling barrier layers 466 and the pin layers 464. Instead, as shown in FIG. 10, a lower interlayer dielectric layer 554a, a magnetic shielding layer 552 and an upper interlayer dielectric layer 554b of an interlayer 550 are stacked from bottom to top, wherein the magnetic shielding layer 552 overlaps tunneling barrier layers 566 of magnetic tunnel junction elements 560 to avoid stray field induced by pin layers 564 from passing through the tunneling barrier layers 566 and affecting free layers 568. Above embodiments are some cases applied the present invention, but the present invention is not restricted to these embodiments.

Figure 11:
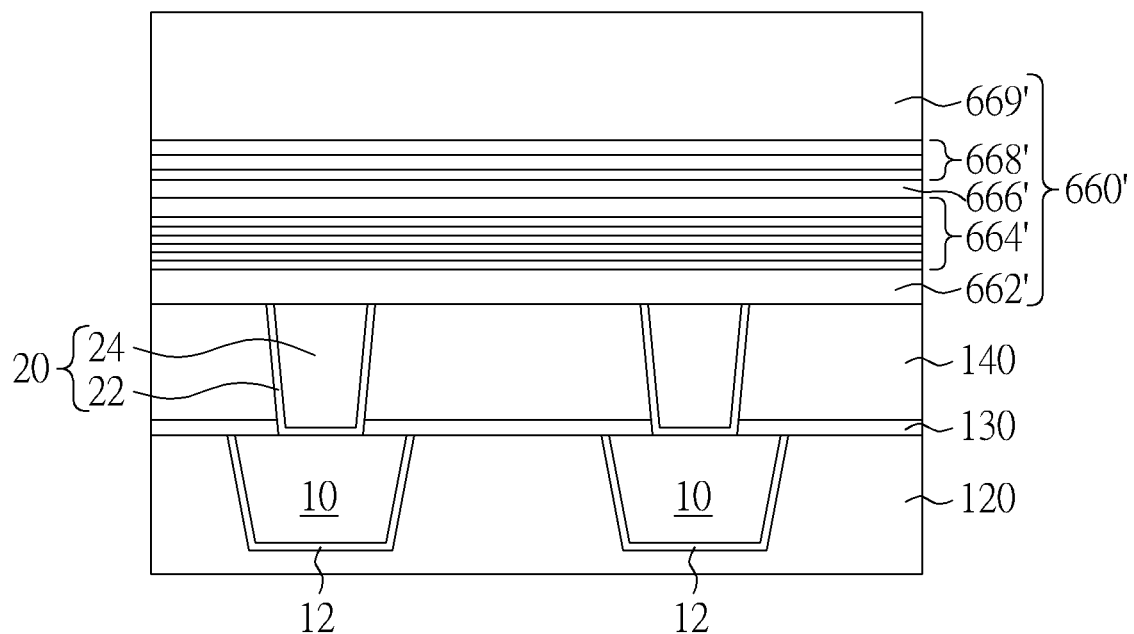
FIG. 11 schematically depicts a cross-sectional view of a method of forming a magnetic tunnel junction (MTJ) device according to an embodiment of the present invention.
Figure 12:
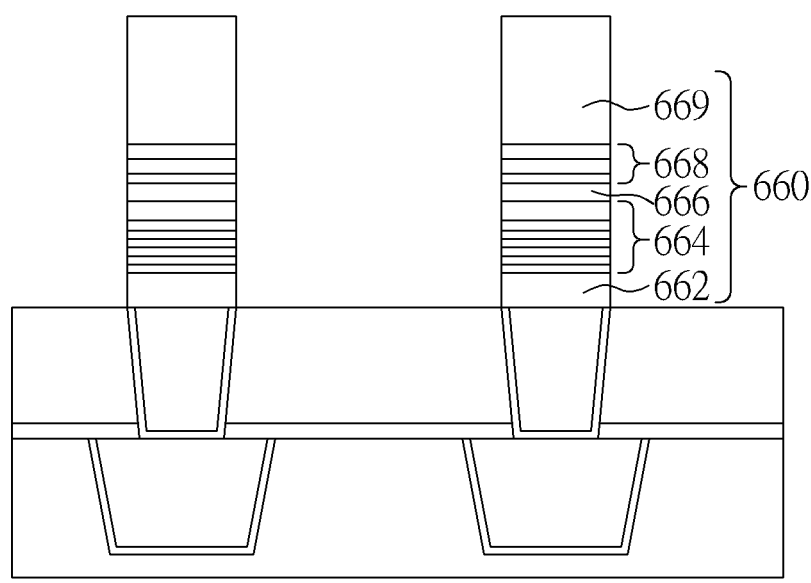
FIG. 12 schematically depicts a cross-sectional view of a method of forming a magnetic tunnel junction (MTJ) device according to an embodiment of the present invention.

In other embodiments, methods of forming magnetic tunnel junction elements and then forming magnetic shielding layers are presented. FIGS. 11-14 schematically depict cross-sectional views of a method of forming a magnetic tunnel junction (MTJ) device according to an embodiment of the present invention. As shown in FIG. 11, the structure including the dielectric layer 120, the metal lines 10, the barrier layers 12, the cap layer 130, the first dielectric layer 140 and the contact plugs 20 and the forming method are common to those of FIG. 1, and thus are not described. Then, a magnetic tunnel junction layer 660' is formed to blanketly cover the first dielectric layer 140, wherein the magnetic tunnel junction layer 660' may include a bottom electrode 662', a pin layer 664', a tunneling barrier layer 666', a free layer 668' and a top electrode 669' stacked from bottom to top. Then, the magnetic tunnel junction layer 660' is patterned to form magnetic tunnel junction elements 660, wherein each of the magnetic tunnel junction elements 660 includes a bottom electrode 662, a pin layer 664, a tunneling barrier layer 666, a free layer 668 and a top electrode 669 stacked from bottom to top, as shown in FIG. 12.

Figure 13:
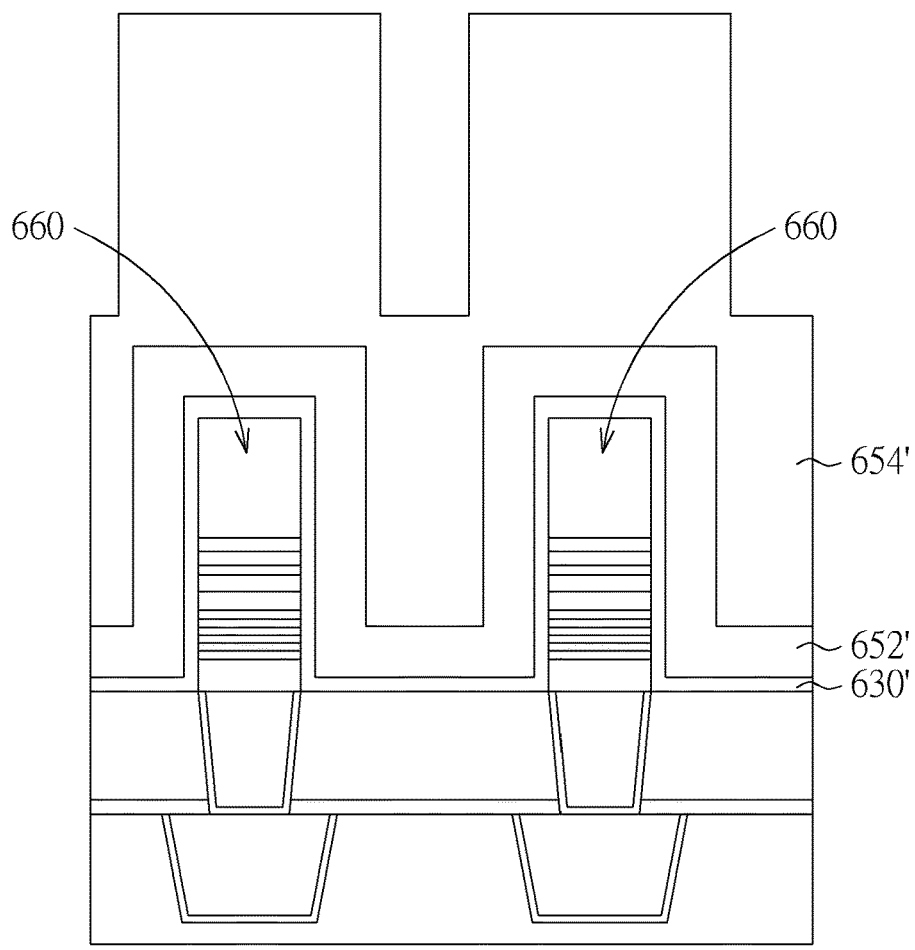
FIG. 13 schematically depicts a cross-sectional view of a method of forming a magnetic tunnel junction (MTJ) device according to an embodiment of the present invention.
Figure 14:
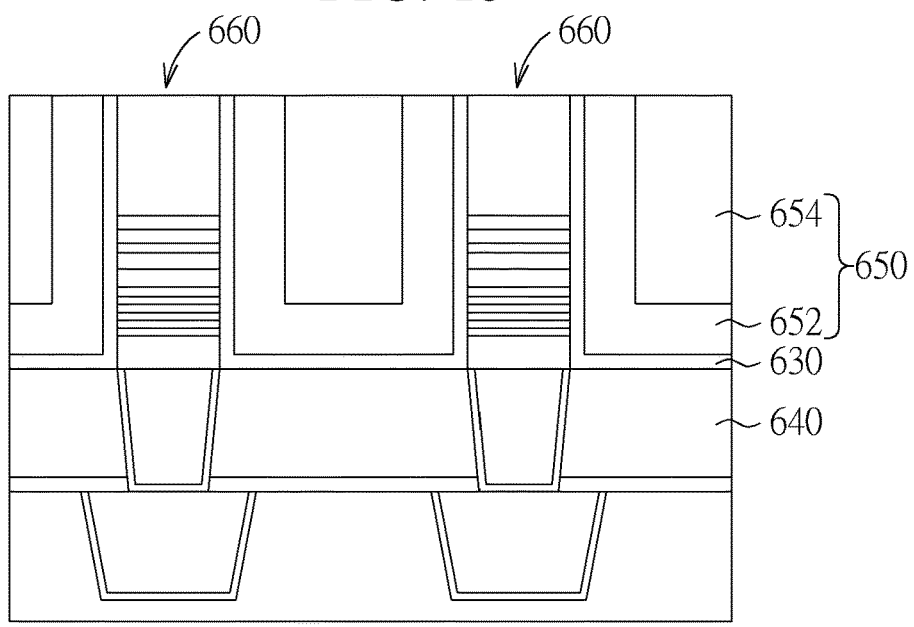
FIG. 14 schematically depicts a cross-sectional view of a method of forming a magnetic tunnel junction (MTJ) device according to an embodiment of the present invention.

Please refer to FIGS. 13-14, an interlayer 650 is formed between the magnetic tunnel junction elements 660. The interlayer 650 must include a magnetic shielding layer 652 to shield stray field. Furthermore, an insulator 630 may be optionally formed between the magnetic tunnel junction elements 660 and the magnetic shielding layer 652 to electrically isolating the magnetic tunnel junction elements 660 from the magnetic shielding layer 652. More precisely, as shown in FIG. 13, an insulator 630' is optionally formed to conformally cover the magnetic tunnel junction elements 660, a magnetic shielding layer 652' is formed to conformally cover the magnetic tunnel junction elements 660 (or the insulator 630'), and then an interlayer dielectric layer 654' is formed to blanketly cover the magnetic tunnel junction elements 660 and the magnetic shielding layer 652'. As shown in FIG. 14, the interlayer dielectric layer 654', the magnetic shielding layer 652' and the insulator 630' are planarized to expose the magnetic tunnel junction elements 660 and form the insulator 630 and the interlayer 650, wherein the interlayer 650 includes the magnetic shielding layer 652 and an interlayer dielectric layer 654. Therefore, a structure including the magnetic shielding layer 652 between the magnetic tunnel junction elements 660 is formed. In this case, the magnetic shielding layer 652 and the insulator 630 have U-shaped cross-sectional profiles, and the magnetic shielding layer 652 and the insulator 630 conformally cover the magnetic tunnel junction elements 660 and a first dielectric layer 640.

The magnetic shielding layer 652 may be composed of diamagnetic materials. As the magnetic shielding layer 652 is a dielectric diamagnetic material layer, the magnetic shielding layer 652 may directly cover or contact the two magnetic tunnel junction elements 660 because of the magnetic shielding layer 652 being a non-conductive layer. Thereby, the insulator 630 may not be formed. As the magnetic shielding layer 152 is a metallic diamagnetic material layer or a nickel iron molybdenum alloy (Mu metal) layer, the insulator 630 should be disposed between the magnetic shielding layer 652 and the magnetic tunnel junction elements 660 to electrically isolate the magnetic tunnel junction elements 660 from the magnetic shielding layer 652.

Figure 15:
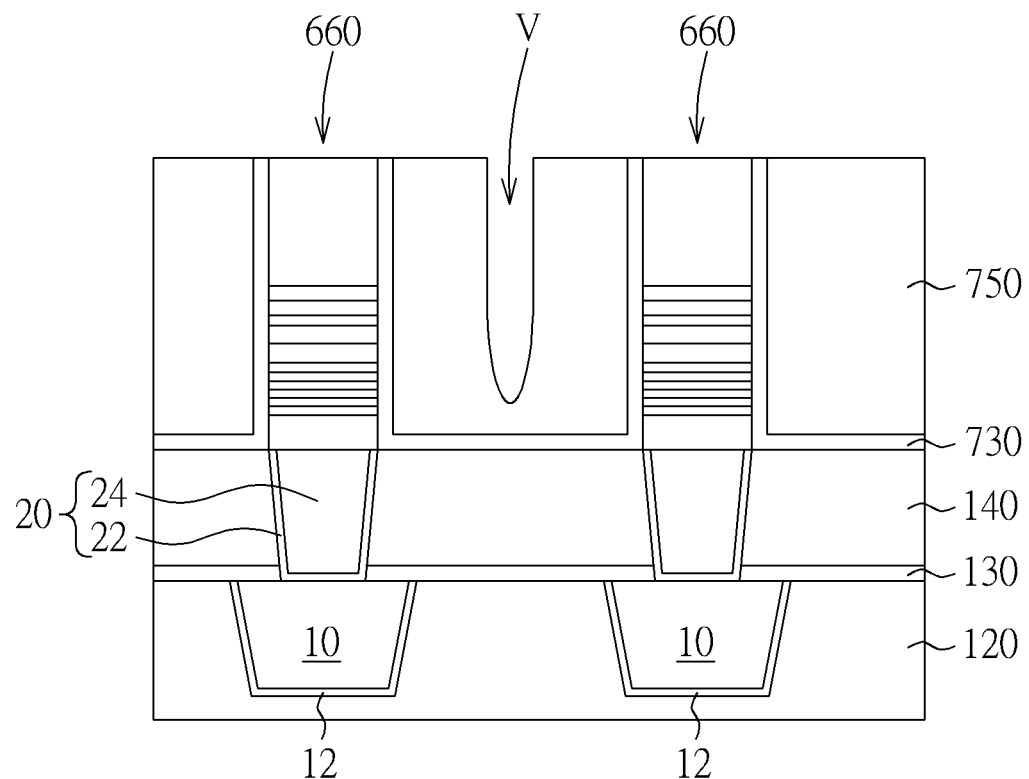
FIG. 15 schematically depicts a cross-sectional view of a method of forming a magnetic tunnel junction (MTJ) device according to an embodiment of the present invention.
Figure 16:
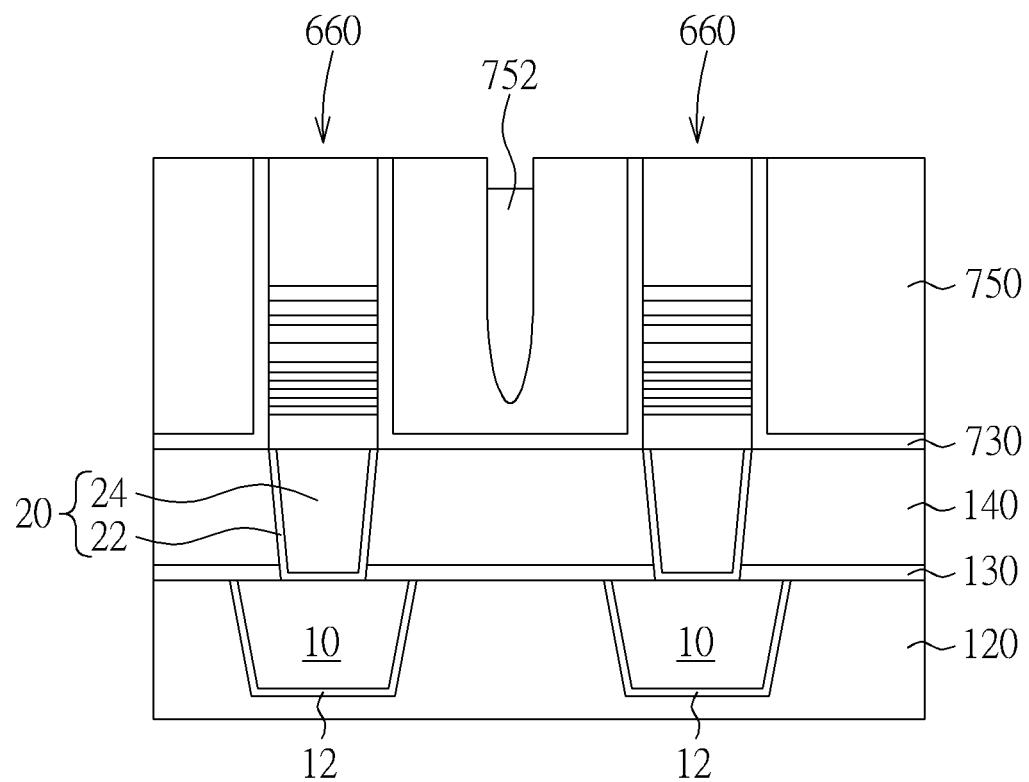
FIG. 16 schematically depicts a cross-sectional view of a method of forming a magnetic tunnel junction (MTJ) device according to an embodiment of the present invention.
Figure 17:
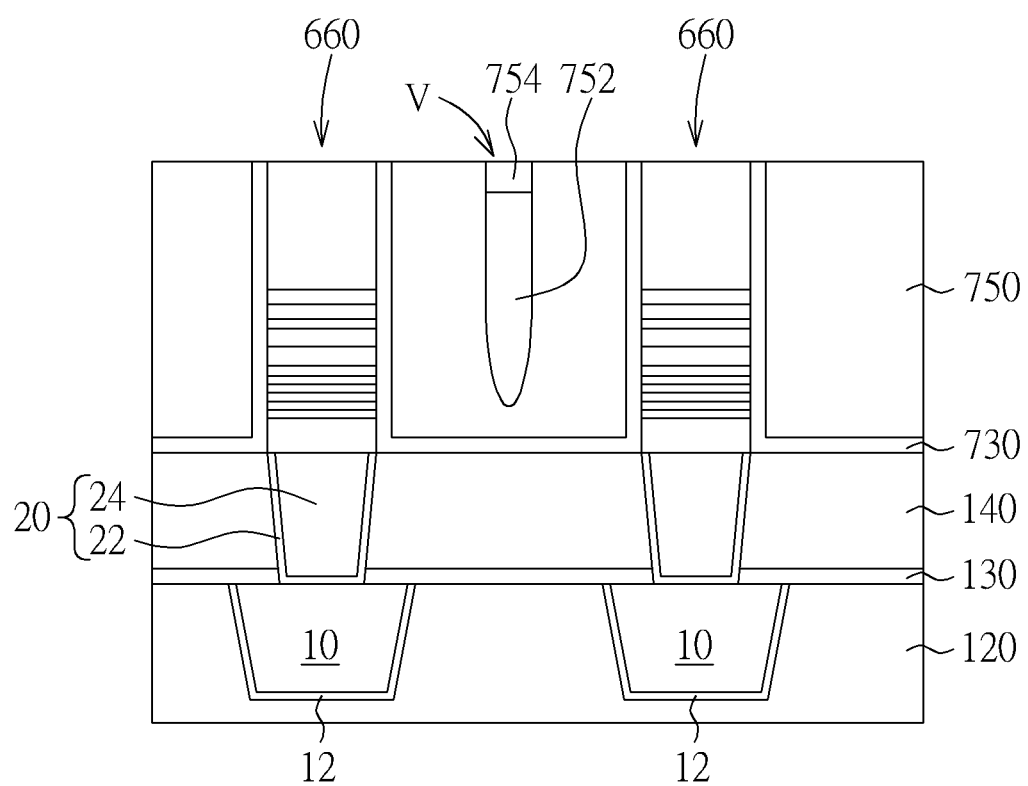
FIG. 17 schematically depicts a cross-sectional view of a method of forming a magnetic tunnel junction (MTJ) device according to an embodiment of the present invention.

In other embodiments, a magnetic shielding layer may fill into an interlayer between magnetic tunnel junction elements instead. FIGS. 15-17 schematically depict cross-sectional views of a method of forming a magnetic tunnel junction (MTJ) device according to an embodiment of the present invention. As shown in FIG. 15, the structure including the dielectric layer 120, the metal lines 10, the barrier layers 12, the cap layer 130, the first dielectric layer 140 and the contact plugs 20 and the forming method are common to those of FIG. 12, and thus are not described. Then, an optional insulator (not shown) and an interlayer dielectric layer (not shown) may be sequentially formed to conformally cover the magnetic tunnel junction elements 660, and the optional insulator (not shown) and the interlayer dielectric layer (not shown) are patterned to form an optional insulator 730 and an interlayer dielectric layer 750 between the magnetic tunnel junction elements 660. Thereafter, the interlayer dielectric layer 750 is etched to form a gap V in the interlayer dielectric layer 750. As shown in FIG. 16, a magnetic shielding layer 752 fills into the gap V. The magnetic shielding layer 752 may be a diamagnetic material layer or a nickel iron molybdenum alloy (Mu metal) layer. Thereafter, as shown in FIG. 17, a cap layer 754 fills into the gap V on the magnetic shielding layer 752, wherein the material of the cap layer 754 is preferably common to the material of the interlayer dielectric layer 750, but it is not limited thereto. Hence, the magnetic shielding layer 752 is formed between the magnetic tunnel junction elements 660.

To summarize, the present invention provides a magnetic tunnel junction (MTJ) device and forming method thereof, which forms a magnetic shielding layer between magnetic tunnel junction elements to shield stray field induced by the magnetic tunnel junction elements, and avoid the stray field from affecting the magnetic moment of each of the magnetic tunnel junction elements itself. More precisely, the magnetic tunnel junction elements may be directly disposed in the magnetic shielding layer; the magnetic tunnel junction elements are disposed in an interlayer dielectric layer, and the magnetic shielding layer and the interlayer dielectric layer may be stacked arranged; the magnetic shielding layer may conformally and directly cover sidewalls of the magnetic tunnel junction elements; or, the magnetic tunnel junction elements may be disposed in an interlayer dielectric layer, and the magnetic shielding layer is disposed in a gap of the interlayer dielectric layer. Furthermore, an insulator may be selectively disposed between the magnetic shielding layer and the magnetic tunnel junction elements, to electrically isolate the magnetic tunnel junction elements from the magnetic shielding layer.

Moreover, a method of forming the magnetic tunnel junction (MTJ) device is presented, which may include filling the magnetic tunnel junction elements into the magnetic shielding layer, forming the magnetic tunnel junction elements and then forming the magnetic shielding layer between the magnetic tunnel junction elements, or filling the magnetic shielding layer into the gap of the interlayer dielectric layer between the magnetic tunnel junction elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A magnetic tunnel junction (MTJ) device, comprising:
two magnetic tunnel junction elements arranged side by side; and
a magnetic shielding layer disposed between the two magnetic tunnel junction elements, wherein the magnetic shielding layer only overlaps partial sidewalls of the magnetic tunnel junction elements.

2. The magnetic tunnel junction (MTJ) device according to claim 1, wherein the two magnetic tunnel junction elements are disposed in a stacked structure of an interlayer dielectric layer.

3. The magnetic tunnel junction (MTJ) device according to claim 2, wherein the stacked structure of the interlayer dielectric layer comprises a lower interlayer dielectric layer and the magnetic shielding layer stacked from bottom to top.

4. The magnetic tunnel junction (MTJ) device according to claim 2, wherein the stacked structure of the interlayer dielectric layer comprises a lower interlayer dielectric layer, the magnetic shielding layer and an upper interlayer dielectric layer stacked from bottom to top.

5. The magnetic tunnel junction (MTJ) device according to claim 1, wherein each of the two magnetic tunnel junction elements comprises a bottom electrode, a pin layer, a tunneling barrier layer, a free layer and a top electrode stacked from bottom to top.

6. The magnetic tunnel junction (MTJ) device according to claim 5, wherein the magnetic shielding layer overlaps at least one of an interface of the pin layer and the tunneling barrier layer, and an interface of the free layer and the tunneling barrier layer.

7. The magnetic tunnel junction (MTJ) device according to claim 5, wherein the magnetic shielding layer overlaps the tunneling barrier layer, the pin layer and the tunneling barrier layer, or the free layer and the tunneling barrier layer.

8. The magnetic tunnel junction (MTJ) device according to claim 1, wherein the magnetic shielding layer comprises diamagnetic materials or paramagnetic materials enclosing the magnetic tunnel junction elements.

9. The magnetic tunnel junction (MTJ) device according to claim 1, wherein the magnetic shielding layer comprises a dielectric diamagnetic material layer.

10. The magnetic tunnel junction (MTJ) device according to claim 1, wherein an insulator and the magnetic shielding layer sequentially cover each of the two magnetic tunnel junction elements.

11. The magnetic tunnel junction (MTJ) device according to claim 10, wherein the magnetic shielding layer comprises a metallic diamagnetic material layer or a Mu metal material layer.

12. The magnetic tunnel junction (MTJ) device according to claim 1, wherein the magnetic shielding layer comprises nickel iron molybdenum alloy layer.

13. A magnetic tunnel junction (MTJ) device, comprising:
two magnetic tunnel junction elements arranged side by side;
an insulator conformally covers each of the two magnetic tunnel junction elements;
a magnetic shielding layer disposed between the two magnetic tunnel junction elements and on the insulator, wherein the magnetic shielding layer comprises a metallic diamagnetic material layer or a metallic paramagnetic material layer; and
an interlayer dielectric layer covers on the insulator, wherein the magnetic shielding layer is disposed in a gap of the interlayer dielectric layer.

14. The magnetic tunnel junction (MTJ) device according to claim 13, wherein each of the two magnetic tunnel junction elements comprises a bottom electrode, a pin layer, a tunneling barrier layer, a free layer and a top electrode stacked from bottom to top.

15. The magnetic tunnel junction (MTJ) device according to claim 13, wherein the magnetic shielding layer comprises nickel iron molybdenum alloy layer.

16. A method of forming a magnetic tunnel junction (MTJ) device, comprising:
- forming a magnetic tunnel junction layer;
- patterning the magnetic tunnel junction layer to form magnetic tunnel junction elements;
- forming an insulator to conformally cover the magnetic tunnel junction elements; and
- forming an interlayer comprising a magnetic shielding layer between the magnetic tunnel junction elements, wherein the magnetic shielding layer comprises a metallic diamagnetic material layer or a metallic paramagnetic material layer, and the steps of forming the interlayer comprising the magnetic shielding layer between the magnetic tunnel junction elements comprise:
- forming an interlayer dielectric layer between the magnetic tunnel junction elements;
- etching the interlayer dielectric layer to form a gap in the interlayer dielectric layer; and
- filling the magnetic shielding layer into the gap.

\* \* \* \* \*